(12) United States Patent
Livesay et al.

(10) Patent No.: US 6,753,129 B2
(45) Date of Patent: Jun. 22, 2004

(54) METHOD AND APPARATUS FOR MODIFICATION OF CHEMICALLY AMPLIFIED PHOTORESIST BY ELECTRON BEAM EXPOSURE

(75) Inventors: William R. Livesay, San Diego, CA (US); Matthew F. Ross, San Diego, CA (US); Richard L. Ross, Del Mar, CA (US)

(73) Assignee: Applied Materials Inc., Santa Clara, CA (US)

( * ) Notice: Subject to any disclaimer, the term of this patent is extended or adjusted under 35 U.S.C. 154(b) by 82 days.

(21) Appl. No.: 10/090,465

(22) Filed: Mar. 4, 2002

(65) Prior Publication Data

US 2003/0108818 A1 Jun. 12, 2003

Related U.S. Application Data

(60) Provisional application No. 60/338,958, filed on Dec. 7, 2001.

(51) Int. Cl.$^7$ ................................................. G03G 5/00
(52) U.S. Cl. ........................ 430/296; 430/311; 430/328; 430/329; 430/942
(58) Field of Search ................................. 430/311, 328, 430/380, 942, 296, 329

(56) References Cited

U.S. PATENT DOCUMENTS

| 5,003,178 A | 3/1991 | Livesay ................... 250/492.3 |
| 6,319,655 B1 | 11/2001 | Wong et al. ................. 430/311 |
| 2001/0016302 A1 | 8/2001 | Hirayanagi et al. ......... 430/322 |

FOREIGN PATENT DOCUMENTS

WO    WO 96/36070    11/1996

OTHER PUBLICATIONS

Olson, Kurt A., et al Characterization, modeling and design of an electrostatic chuck with improved wafer temperature uniformity. Rev. Sci. Instrum. 66 (2) Feb. 1995.

Electrostatic Wafer Holder for Wafer Cooling During Reactive Ion Etching. IBM Technical Disclosure Bulletin vol. 31, No. 1, Jun. 1988 Armonk, New York.
"Synthesis of Siloxanes and Silsesquioxanes for 157 nm Microlithography", Houng V. Tran, et al. Polymeric Materials: Science & Engineering 2001, 84.xxx.
"Electron Beam Processing of Deep–UV Resist", M.F. Ross, et al. pp. 02–19.
"157 nm Resist Materials: Progress Report", Colin Brodsky, et al. Dept. of Chemistry and Chemical Engineering, The University of Texas at Austin, Austin, Texas 78735. pp. 3396–3401.
"E–Beam Stabilization of ArF (193 nm) Photoresist for Implementation of Sub–100nm Devices", Cha–Won Koh, et al. Memory R&D Division, Hynix Semiconductor, Inc., pp. 02–11.
"Organic Imaging Materials: A View of the Future", Michael D. Stewart, et al. Journal of Physical Organic Chemistry, J. Phys. Org. Chem. 2000; 13: 767–774.

*Primary Examiner*—Christopher G. Young
(74) *Attorney, Agent, or Firm*—Roberts & Mercanti

(57) ABSTRACT

A method for increasing the etch resistance of positive working chemically amplified photoresist such as 193 nanometer sensitive photoresist, 157 nanometer sensitive photoresist, and deep-UV 248 nanometer sensitive photoresist while improving and maintaining fidelity of lithographic features and critical dimensions. The method involves coating and drying a photosensitive composition onto a substrate. The photosensitive composition comprises a water insoluble, acid decomposable polymer which is substantially transparent to ultraviolet or x-ray radiation and a compound capable of generating an acid upon exposure to sufficient activating ultraviolet, electron beam or x-ray radiation energy. After imagewise exposing and developing, the image areas of the photosensitive composition are irradiated to electron beam radiation to thereby increase the resistance of the photosensitive composition in the image areas to an etchant while simultaneously cooling the photosensitive composition during electron beam radiation to maintain the photosensitive composition at a temperature of less than about 20° C.

21 Claims, 6 Drawing Sheets

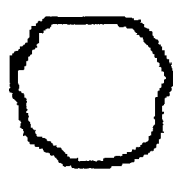
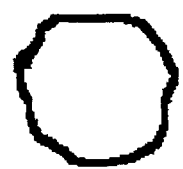
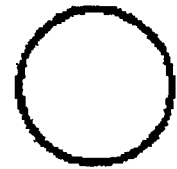
Fig. 5a    Fig. 5b    Fig. 5c
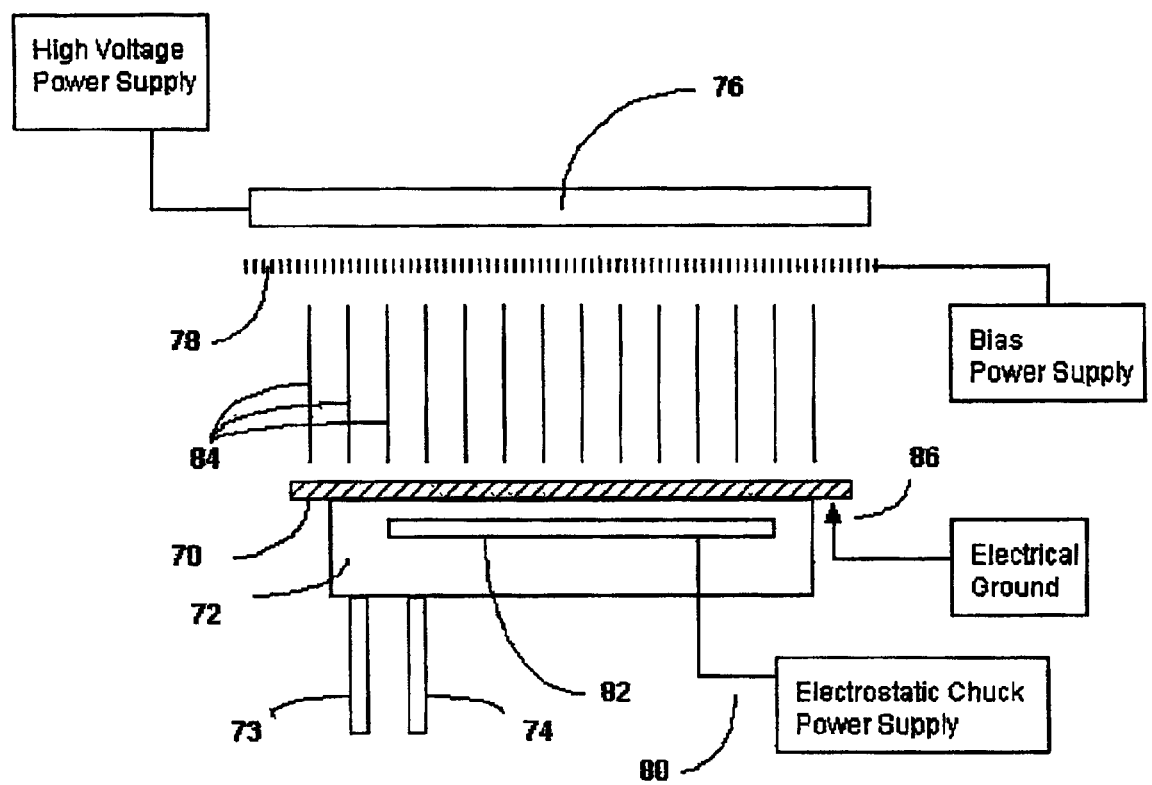
Fig. 6

Δ 36 nm
No curing

Δ 63 nm
Std. process

Δ 36 nm
ESC process

Δ 27 nm
LT process

METHOD AND APPARATUS FOR MODIFICATION OF CHEMICALLY AMPLIFIED PHOTORESIST BY ELECTRON BEAM EXPOSURE

CROSS REFERENCE TO RELATED APPLICATION

This application claims the benefit of U.S. Provisional Patent Application Serial No. 60/338,958, filed on Dec. 7, 2001, which is incorporated herein by reference.

BACKGROUND OF THE INVENTION

1. Field of Invention

The present invention relates to a method and apparatus for increasing the etch resistance of photoresists which are suitable for use in the production of electronic devices such as integrated circuits. More particularly, the invention provides an improved process for increasing the etch resistance of positive working chemically amplified photoresists such as 193 nm, 157 nm, deep-UV 248 nm and x-ray wavelength sensitive, and electron beam sensitive photoresists while improving and maintaining fidelity of lithographic features and critical dimensions.

2. Description of the Related Art

The production of positive photoresists is well known in the art as exemplified by U.S. Pat. Nos. 3,666,473; 4,115,128 and 4,173,470. These contain aqueous alkali soluble polyvinyl phenol or phenol formaldehyde novolak resins together with light sensitive materials, usually a substituted naphthoquinone diazide compound. The resins and sensitizers are dissolved in an organic solvent and are applied as a thin film coating to a substrate suitable for the particular application desired. The resin component of photoresist formulations is soluble in an aqueous alkaline solution, but the photosensitizer is not. Upon imagewise exposure of the coated substrate to actinic radiation, the exposed areas of the coating are rendered more soluble than the unexposed areas. This difference in solubility rates causes the exposed areas of the photoresist coating to be dissolved when the substrate is immersed in an alkaline developing solution, while the unexposed areas are substantially unaffected, thus producing a positive image on the substrate. The uncovered substrate is thereafter subjected to an etching process. Frequently, this involves a plasma etching against which the resist coating must be sufficiently stable. The photoresist coating protects the covered areas of the substrate from the etchant and thus the etchant is only able to etch the uncovered areas of the substrate. Thus, a pattern can be created on the substrate which corresponds to the pattern of the mask or template that was used to create selective exposure patterns on the coated substrate prior to development.

Photoresists are either positive working or negative working. In a negative working resist composition, the imagewise light struck areas harden and form the image areas of the resist after removal of the unexposed areas with a developer. In a positive working resist the exposed areas are the non-image areas. The light struck parts are rendered soluble in aqueous alkali developers. The ability to reproduce very small dimensions, is extremely important in the production of large scale integrated circuits on silicon chips and similar components. As the integration degree of semiconductor devices becomes higher, finer photoresist film patterns are required. One way to increase circuit density on a semiconductor chip is by increasing the resolution capabilities of the resist. Positive photoresists have been found to be capable of much higher resolution and have almost universally replaced negative resists for this purpose.

The optimally obtainable microlithographic resolution is essentially determined by the radiation wavelengths used for the selective irradiation. However the resolution capacity that can be obtained with conventional deep UV microlithography has its limits. In order to be able to sufficiently resolve optically small structural elements, wavelengths shorter than deep UV radiation must be utilized. The use of UV radiation has been employed for many applications, particularly radiation with a wavelength of 157 nm, 193 nm and 248 nm. In particular, the radiation of lasers is useful for this purpose. The deep UV photoresist materials that are used today, however, are not suitable for 157 nm, 193 nm and 248 nm exposure. Materials based on phenolic resins as a binding agent, particularly novolak resins or polyhydroxystyrene derivatives have too high an absorption at wavelengths and one cannot image through films of the necessary thickness. This high absorption results in side walls of the developed resist structures which do not form the desired vertical profiles. Rather they have an oblique angle with the substrate which causes poor optical resolution characteristics at these short wavelengths. Polyhydroxystyrene based resists can be used in top surface imaging applications in which a very thin (~500 Å) layer of resist is required to be transparent at ArF laser exposure wavelengths.

Chemical amplification photoresists have been developed, which have been found to have superior resolution. 157 nm, 193 nm and 248 nm photoresists are based on chemically amplified deprotection. With this mechanism, a molecule of photogenerated acid catalyzes the breaking of bonds in a protecting group of a polymer. During the deprotecting process, another molecule of the same acid is created as a byproduct, and continues the acid-catalytic deprotection cycle. The chemistry of a 157 nm, 193 nm and 248 nm photoresist is based on polymers such as, but not limited to, acrylates, cyclic olefins with alicyclic groups, and hybrids of the aforementioned polymers which lack aromatic rings. However, chemically amplified resist films have not played a significant role in the fine pattern process using deep UV because they lack sufficient etch resistance, thermal stability, post exposure delay stability and processing latitude. While such photoresists are sufficiently transparent for deep uv radiation, they do not have the etching stability customary for resists based on phenolic resins for plasma etching. A typical chemical amplification photoresist film comprises a polymer, a photoacid generator, and other optional additives. The polymer is required to be soluble in the chosen developer solution, and have high thermal stability and low absorbance to the exposure wavelength in addition to having excellent etch resistance. It would be desirable to overcome the above mentioned problems and to provide a photoresist film superior in etch resistance, as well as transmittance to deep UV.

There have been several attempts to solve this problem. One attempt to improve the etching stability of photoresists based on meth(acrylate) polymers introduced cycloaliphatic groups into the meth(acrylate) polymers. This leads to an improvement in etching stability, but not to the desired extent. Another proposal aims at producing sufficient etching stability only after irradiation in the resist coating. It has also been proposed to treat the substrate with the finished, developed, image-structured photoresist coating with specific alkyl compounds of magnesium or aluminum, in order to introduce the given metals in the resist material as etching barriers (See U.S. Pat. No. 4,690,838). The use of metal-containing reagents, however, is generally not desired in microlithography process, due to the danger associated with contamination of the substrate with metal ions.

U.S. Pat. No. 6,319,655, which is incorporated herein by reference, describes a process for improving the etch resistance of chemically amplified resists, in particular 193 nm sensitive photoresists, using a large area electron beam exposure. Electron beam exposure of chemically amplified photoresists, in particular 193 nm sensitive photoresists has been shown to improve the etch resistance and thermal stability of these photoresists. Many different formulations of chemically amplified photoresist utilized for 193 nm exposure have been developed. Some examples of materials used for 193 nm lithography are given in U.S. Pat. No. 6,319,655. For the next generation of lithography, new resist materials sensitive to 157 nm irradiation will be utilized for this application. Some of these materials (incorporated herein by reference) are listed in "Organic Imaging Materials, A View of the Future" by Michael Stewart et al., Journal of Physical Organic Chemistry, *J. Phys. Org. Chem.* 2000; 13: 767–774, "157 nm Resist Materials: Progress Report" by Colin Brodsky et al., *J. Vac. Sci. Technol.* B 18(6), November/December 2000, 3396–3401, and in "Synthesis of Siloxanes and Silsesquioxanes for 157m Microlithography" by Hoang V. Tran, et al, *Polymeric Materials: Science & Engineering* 2001, 84. Due to the volatility of the additives in these resist materials, electron beam exposure causes the expulsion of these additives, which causes shrinking of the resist. For 248 nm, 193 nm, and 157 nm resist technologies, chemical amplification is used to achieve high photo speed at the low exposure energies of the selected wavelength sources. For future lithography generations using extreme ultraviolet and x-ray wavelengths of 1–100 nanometers, similar chemically amplified resists are anticipated. The basic resist design concept is to start with a resin that has good transparency at the selected wavelength. The resin must be highly soluble in aqueous base developer chemistry. To make the resin insoluble in the developer, dissolution inhibitors, sometimes called blocking or protecting groups, are attached to the resin. These are usually very large, or bulky, molecules that are attached to the resin via bonds that can be easily cleaved. In most advanced resist systems there are usually several types of molecules attached to the resin in addition to the dissolution inhibitor. These include molecules that enhance the etch resistance of the material as well as molecules that help with lithographic performance. All of these molecules are attached to the resin via a link that is easily cleaved. The chemical amplification is achieved by adding a small amount of a photo-acid generator (PAG). This is a compound that generates a proton ($H^+$) when exposed at the appropriate wavelength. These are usually onium salts, such as sulfonium salts, but it can be any of a number of suitable compounds. When the PAG is exposed and the proton is generated, the proton cleaves the nearest available bond between the resin and dissolution inhibitor. This cleaving reaction generates another proton, which cleaves the next nearest bond, and so on. This reaction can occur during the optical exposure, for low activation energy resists, or during the subsequent post-exposure bake (PEB), for high activation energy resists. The result of the de-protection reaction is the formation of an acid, which is then soluble in an aqueous base developer. As a result of the cleaving of the link between the resin and the blocking group, the blocking molecule usually leaves the resist as a volatile. In this way the resist can be fully exposed even though the incident optical exposure dose is very low, on the order of 10 to 20 $mJ/cm^2$. After the optical exposure and completion of the de-protection reactions, the resist in the exposed areas can shrink from ten to twenty percent. This is due to the loss of the bulky protecting groups as volatiles. This reaction does not happen in the unexposed areas, which provides the contrast to form the images. Since the unexposed resist still contains the resin with the attached blocking groups, it is susceptible to shrinkage if these molecules are removed.

Due to the constraints of the resist design, and since the blocking groups are easily cleavable, the blocking groups can be removed by other means. One reaction path is thermal activation, where the resist is heated to a temperature that thermally breaks the bonds. This happens at different temperatures for the different protection groups but can be a low as 40° C. to as high as 200° C. Thermal activation results in the loss of the blocking groups as volatiles and a shrinkage of the resist. The blocking groups can also be removed by other radiation sources including plasma discharges, or accelerated particles.

During electron beam exposure, a reaction that is similar to the optical exposure can occur which cleaves the link between the protecting groups and the resin resulting in shrinkage of the resist. This reaction, and the associated resist shrinkage, is accelerated as the resist is heated by the energy of the incident electron beam. Since the full thickness of the resist is targeted for stabilization, substantial mass loss, and shrinkage, can result from the electron beam exposure. Because the interface between the resist and substrate is constrained, the remainder of the resist shrinks in three dimensions. This leads to a phenomenon know as "pullback" where the top of the resist shrinks relative to the bottom. This effect is most pronounced on lithographic features such as contacts, line ends, and feature corners. The pullback phenomenon has undesired effects on the features, which make them unacceptable for device fabrication. This shrinkage occurs throughout the exposed regions of the photoresist and can cause deformation in the form of pullback on the upper portions of lithography features.

Many attempts have been made to correct or eliminate this resist deformation or pullback by using different process steps with the electron beam exposure. Lower current density exposures have been attempted to minimize the shrinkage as well as surface curing of the photoresist, that is, lowering the energy of electrons such that only the upper portion of the resist receives the electron beam exposure. Higher doses of electrons have been utilized at the lower portion, relatively to the upper portion, of the resist in an effort to minimize this pullback. In addition, different formulations of photoresist have been attempted to minimize the shrinkage and expulsion of resist components to minimize the pullback. Lower flux electrons with longer exposure times have also been utilized to minimize resist heating effects thereby reducing the temperature of the resist during electron beam exposure to no more than 50° C. All of these attempts have failed at reducing the pullback effect caused by the electron beam hardening process.

Surprisingly, it has now been found that by simultaneously actively cooling the wafer to hold a temperature below 20° C. and preferably below 10° C. that the pullback on the upper region of lithographic images in resist can be virtually eliminated during electron beam processing. This unexpected result is due to the fact that the glass transition temperature of these photoresists is much higher than 20° C. For example, these photoresists are typically baked at temperatures in excess of 80° C. after lithographic patterning. It is therefore surprising since there is very little difference in volume shrinkage and no compositional changes (at least detected by FTIR), that cooling the resist would effect the resist deformation.

Eliminating deformation of the lithographic features during e-beam exposure, the holding of the vertical wall profile, and the improvement in the uniformity and circularity of the contact holes in photoresist is an unexpected result because the resist exhibits almost the same amount of volume shrinkage (measured vertically) as in the known process described in U.S. Pat. No. 6,319,655. There is only a slight change in the total bulk shrinkage between the standard process and the cooled process, and the chemical composition of the film is not altered by cooling. Therefore it has been unexpectedly found that cooling the wafer results in a marked improvement to the stability of the lithographic features of these chemically amplified resists.

SUMMARY OF THE INVENTION

The invention provides a method for producing an etch resistant image, which comprises:

(a) coating and drying a photosensitive composition onto a substrate, which photosensitive composition comprises:
  (i) at least one water insoluble, acid decomposable polymer which is substantially transparent to ultraviolet or x-ray radiation, wherein said polymer is present in the photosensitive composition in an amount sufficient to form a uniform film of the composition components when it is coated on a substrate and dried;
  (ii) at least one photosensitive compound capable of generating an acid upon exposure to sufficient activating ultraviolet, electron beam or x-ray radiation energy, said photosensitive compound being present in an amount sufficient to substantially uniformly photosensitive the photosensitive composition;
(b) imagewise exposing the photosensitive composition to sufficient activating ultraviolet, electron beam or x-ray radiation energy to cause the photosensitive compound to generate sufficient acid to decompose the polymer in the imagewise exposed areas of the photosensitive composition;
(c) developing the photosensitive composition to thereby remove the exposed nonimage areas and leaving the unexposed image areas of the photosensitive composition;
(d) irradiating the image areas of the photosensitive composition to sufficient electron beam radiation to thereby increase the resistance of the photosensitive composition in the image areas to an etchant while simultaneously cooling the photosensitive composition during electron beam radiation to maintain the photosensitive composition at a temperature of less than about 20° C.

The invention also provides a method for producing a microelectronic device image, which comprises:

(a) coating and drying a photosensitive composition onto a semiconductor substrate, which photosensitive composition comprises:
  (i) at least one water insoluble, acid decomposable polymer which is substantially transparent to ultraviolet or x-ray radiation, wherein said polymer is present in the photosensitive composition in an amount sufficient to form a uniform film of the composition components when it is coated on a substrate and dried;
  (ii) at least one photosensitive compound capable of generating an acid upon exposure to sufficient activating ultraviolet, electron beam or x-ray radiation energy, said photosensitive compound being present in an amount sufficient to substantially uniformly photosensitize the photosensitive composition;
(b) imagewise exposing the photosensitive composition to sufficient activating ultraviolet, electron beam or x-ray radiation energy to cause the photosensitive compound to generate sufficient acid to decompose the polymer in the imagewise exposed areas of the photosensitive composition;
(c) developing the photosensitive composition to thereby remove the exposed nonimage areas and leaving the unexposed image areas of the photosensitive composition;
(d) irradiating the image areas of the photosensitive composition to sufficient electron beam radiation to thereby increase the resistance of the photosensitive composition in the image areas to an etchant while simultaneously cooling the photosensitive composition during electron beam radiation to maintain the photosensitive composition at a temperature of less than about 20° C.

The invention further provides a microelectronic device image produced by a process, which comprises:

(a) coating and drying a photosensitive composition onto a semiconductor substrate, which photosensitive composition comprises:
  (a) coating and drying a photosensitive composition onto a semiconductor substrate, which photosensitive composition comprises:
    (i) at least one water insoluble, acid decomposable polymer which is substantially transparent to ultraviolet or x-ray radiation, wherein said polymer is present in the photosensitive composition in an amount sufficient to form a uniform film of the composition components when it is coated on a substrate and dried;
    (ii) at least one photosensitive compound capable of generating an acid upon exposure to sufficient activating ultraviolet, electron beam or x-ray radiation energy, said photosensitive compound being present in an amount sufficient to substantially uniformly photosensitive the photosensitive composition;
  (b) imagewise exposing the photosensitive composition to sufficient activating ultraviolet, electron beam or x-ray radiation energy to cause the photosensitive compound to generate sufficient acid to decompose the polymer in the imagewise exposed areas of the photosensitive composition;
  (c) developing the photosensitive composition to thereby remove the exposed nonimage areas and leaving the unexposed image areas of the photosensitive composition;
  (d) irradiating the image areas of the photosensitive composition to sufficient electron beam radiation to thereby increase the resistance of the photosensitive composition in the image areas to an etchant while simultaneously cooling the photosensitive composition during electron beam radiation to maintain the photosensitive composition at a temperature of less than about 20° C.

The invention still further provides an electron beam exposure apparatus which comprises a) an enclosure;
b) an electrostatic chuck within the enclosure for holding a wafer during electron beam exposure, which electrostatic chuck comprises:
  i) an electrically conductive wafer support having an electrically conductive top surface;

ii) a nonelectrically conductive layer on the wafer support;

iii) means for applying a substantially uniform electric field across said electrically conductive surface for holding a wafer on the support via the nonelectrically conductive layer;

b) an electron beam source within the enclosure which directs a wide, large beam of uniform electron beam radiation toward the wafer support;

c) a refrigerant within the enclosure which maintains a wafer positioned on the wafer support at a temperature of less than 20° C. during electron beam irradiation.

BRIEF DESCRIPTION OF THE DRAWINGS

FIG. 5a represents a contact hole or via prior to e-beam exposure which is not perfectly round and shows asymmetries when viewed from the top surface of the via.

FIG. 5b represents a contact hole or via after the standard process (non cooled) e-beam exposure, wherein the contact hole remains asymmetric and deformed.

FIG. 5c represents a contact hole or via after the process of the invention using electron beam flood expose and simultaneous cooling wherein the contact hole formed has a uniform circular shape.

FIG. 6 shows an apparatus for performing the process of invention.

DETAILED DESCRIPTION OF THE PREFERRED EMBODIMENT

Figure 1A:
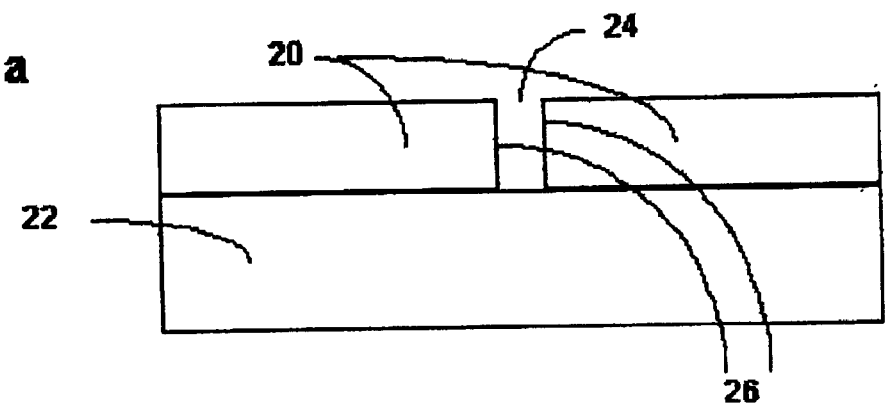
FIG. 1a shows a cross section of a contact hole in an exposed and developed photoresist before electron beam exposure, which illustrates the contact hole having vertical sidewalls from the top surface of the photoresist down to the substrate.

The first step of the process according to the invention is coating and drying a photosensitive composition onto a substrate: The photosensitive compositions useful for the invention are themselves well known in the art and are composed of a mixture of a water insoluble, acid decomposable polymer which is substantially transparent to ultraviolet or x-ray radiation at a wavelength of about 157 nm, 193 nm, 248 nm or those of x-rays; a photosensitive compound capable of generating an acid upon exposure to sufficient activating energy at a wavelength of about 157 nm, 193 nm, 248 nm or those wavelengths of x-rays, or electron beams. Microelectronic devices may be produces when the substrate is a semiconductor material.

Suitable substrates nonexclusively include silicon, aluminum, lithium niobate, polymeric resins, silicon dioxide, doped silicon dioxide, gallium arsenide, Group III/V compounds, silicon nitride, tantalum, copper, polysilicon, ceramics and aluminum/copper mixtures. Semiconductor substrates are most preferred. Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

Acid decomposable polymers suitable for a chemical amplification photoresists are well known in the art and nonexclusively include cyclic olefins, and acrylics and methacrylates such as polyalkylacrylates and polyalkylmethacrylates, norbornene containing polymers, and alicyclic polymers. The most widely employed route involves free radical copolymerization of maleic anhydride with a cyclic olefin monomer. The maleic anhydride serves as an oxygen-rich polar unit whose hydrophilic nature offsets the hydrophobic nature of the cyclic olefin monomer. Others polymers include polymethylacrylate and polymethylmethacrylate (PMMA) as well as copolymers thereof and polymers which have a backbone of polymethylmethacrylate having pendant groups which do not substantially reduce the transparency of the polymer at the wavelengths of interest. PMMA has a particularly high transmittance to the light of 193 nm wavelength and it is known for its clarity, surface hardness, UV transparency and chemical resistance. PMMA is readily commercially available from Aldrich Chemical Company of Milwaukee, Wis. Preferably the polymer has a molecular weight in the range of from about 1,000 to about 800,000. Alicyclic polymers include acrylate/alicyclic polymers such as hybrid polymers produced by the free radical copolymerization of norbornene, maleic anhydride and either acrylic acid or t-butyl acrylate. A terpolymer of acrylonitrile, tertiary-butyl methacrylate and methacrylic acid has also been shown to have high transparency at 193 nm and excellent dry etch resistance. Siloxanes, silsesquioxane and poly{5-(2-t-butoxycarbonyloxy-2-trifluoromethyl-3,3,3-trifluoropropyl)norbornene] and hexafluoro-2-propanol polymers are useful for 157 nm sensitive compositions. Poly(4-hydroxystyrene) and poly(4-tert-butyloxy-carbonyloxystyrene)polymers are useful for 248 nm photoresist compositions.

The light sensitive composition may be formed by admixing the ingredients in a suitable solvent composition. In the preferred embodiment the polymer is preferably present in the overall composition in an amount of from about 50% to about 99% based on the weight of the solid, i.e. non-solvent parts of the composition. A more preferred range of copolymer would be from about 80% to about 99% and most preferably from about 82% to about 95% by weight of the solid composition parts. The photosensitive compound is preferably present in an amount ranging from about 1% to about 20% based on the weight of the solid, i.e., non-solvent parts of the composition. A more preferred range of the photosensitive compound would be from about 5% to about 20% by weight of the solid composition parts. In preparing the composition, the polymer and photosensitive compound are mixed with a sufficient amount of a solvent composition to form a uniform solution. Such solvents include propylene glycol alkyl ether acetate, butyl acetate, ethylene glycol monoethyl ether acetate, diglyme, cyclopentanone and propylene glycol methyl ether acetate, among others. The composition may additionally contain additives such as colorants, dyes, anti-striation agents, leveling agents, crosslinkers, plasticizers, adhesion promoters, speed enhancers, solvents, acid generators, dissolution inhibitors and non-ionic surfactants.

Useful photosensitive compounds capable of generating an acid upon exposure to sufficient activating energy at a wavelength of about 157 nm, 193 nm, 248 nm or those of x-rays, or electron beams include onium salts such as sulfonium, diazonium and iodonium salts. Sulfonium salts are described in U.S. Pat. No. 4,537,854; diazonium salts are described in Light Sensitive Systems, Kosar, J.; John Wiley & Sons, New York, 1965. Iodonium salts are described in U.S. Pat. No. 4,603,101.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) in an amount of from about 1.0 to about 10.0 percent, based on the combined weight of the solid parts of the composition. The dye additives help provide increased resolution by inhibiting back scattering of light off the substrate. Anti-striation agents may be used up to five percent weight level, based on the combined weight of solids. Adhesion promoters which may be used include, for example, beta-(3,4-epoxy-cyclohexyl)-ethyltrimethoxysilane; p-methyl-disilane-methyl methacrylate; vinyltrichlorosilane; and gamma-amino-propyl triethoxysilane up to a 4.0 percent based on the combined weight of solids. Speed enhancers that may be used include, for example, picric acid, nicotinic acid or nitrocinnamic acid at up to 20 percent, based on the combined weight of copolymer and solids. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas. Non-ionic surfactants that may be used include, for example, nonylphenoxy poly(ethyleneoxy)ethanol; octylphenoxy(ethyleneoxy)ethanol; and dinonyl phenoxy poly(ethyleneoxy)ethanol at up to 10 percent based on the combined weight of solids.

Photoresists which are photosensitive at 157 nm, 193 nm and 248 nm or x-ray wavelengths or sensitive to electron beam radiation are well known in the art and widely commercially available, Such include K98 and D3 available from the Shipley Company; 620-10 from Olin Microelectronics Materials, AM01, AM02 and AM03 from Japan Synthetic Rubber Company, TOK-TArF-5A-1 and TOK-TArF-6A-1 from Tokyo Ohka Kogyo Co. Ltd, DUV-18L from Brewer Science. Other suitable photoresists include solutions of polymethylmethacrylate (PMMA), such as a liquid photoresist available as 496 k PMMA, from OLIN HUNT/OCG, West Paterson, N.J. 07424, comprising polymethylmethacrylate with molecular weight of 496,000 dissolved in chlorobenzene (9 wt %); P(MMA-MAA) (poly methyl methacrylate-methacrylic acid); PMMA/P(MMA-MAA) polymethylmethacrylate/(poly methyl methacrylate-methacrylic acid). Other photoresists which are photosensitive at 157 nm, 193 nm and 248 nm and x-ray wavelengths are commercially available from a number of sources, including Shipley Company, Kodak, Hoechst Celanese Corporation, Clariant, Hunt, Arch Chemical, Aquamer, JSR Microelectronics, and Brewer. Numerous publications discuss the improved performance of these photoresists using a large area electron beam exposure of these materials, including "Modification of 193 nm (ArF) Photoresists by Electron Beam Stabilization" by Patrick Martens et al., and "Investigation of Electron Beam Stabilization of 193 nm Photoresists" by Myoung-Soo Kim et al, SPIE Microlithography 2001 Conference Proceedings; "Organic Imaging Materials, A View of the Future" by Michael Stewart et al., Journal of Physical Organic Chemistry, *J. Phys. Org. Chem.* 2000; 13: 767–774, "157 nm Resist Materials: Progress Report" by Colin Brodsky et al., *J. Vac. Sci. Technol.* B 18(6), November/December 2000, 3396–3401, and in "Synthesis of Siloxanes and Silsesquioxanes for 157 m Microlithography" by Hoang V. Tran, et al, *Polymeric Materials: Science & Engineering* 2001, 84. A useful 248 nm photoresist is DX-1179 available from Clariant Corporation.

In the production of the microelectronic device of the present invention, one coats and dries the foregoing photosensitive composition on a suitable substrate. The prepared resist solution can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. In a preferred embodiment of the invention, the photoresist layer is formed by centrally applying a liquid photoresist composition to the upper surface on a rotating wheel at speeds ranging from about 500 to about 6000 rpm, preferably from about 1500 to about 4000 rpm, for about 5 to about 60 seconds, preferably from about 10 to about 30 seconds, in order to spread the composition evenly across the upper surface. The thickness of the photoresist layer may vary depending on the amount of liquid photoresist composition that is applied, but typically the thickness may range from about 500 Å to about 50,000 Å, and preferably from about 2000 Å to about 12000 Å. The amount of photoresist composition which is applied may vary from about 1 ml to about 10 ml, and preferably from about 2 ml to about 8 ml depending on the size of the substrate.

After the resist composition solution is coated onto the substrate, the substrate is temperature treated at approximately 20° C. to 200° C. This temperature treatment is done in order to reduce and control the concentration of residual solvents in the photoresist while not causing substantial thermal degradation of the photosensitizer. In general one desires to minimize the concentration of solvents and thus this temperature treatment is conducted until substantially all of the solvents have evaporated and a thin coating of photoresist composition, on the order of 200–500 nm in thickness, remains on the substrate. In a preferred embodiment the temperature treatment is conducted at from about 50° C. to about 150° C. A more preferred range is from about 70°C. to about 90° C. This treatment is conducted until the rate of change of solvent removal becomes relatively insignificant. The temperature and time selection depends on the resist properties desired by the user as well as equipment used and commercially desired coating times. Commercially acceptable treatment times for hot plate treatment are those up to about 3 minutes, more preferably up to about 1 minute. In one example, a 30 second treatment at 90° C. is useful. Treatment times increase to about 20 to about 40 minutes when conducted in a convection oven at these temperatures.

After deposition onto the substrate, the photoresist layer is imagewise exposed, to a source of ultraviolet or x-ray radiation through an etch mask. This exposure renders the photoresist layer more soluble after exposure than prior to exposure. When such a chemical amplification resist is exposed to light, activated acid induces a catalytic chain reaction to a photoresist film organic polymer, generating a significant amount of protons. In the resist, protons bring a large change into the solubility of the resin. When the photoresist film is irradiated by a high energy beam, acid ($H^+$) is generated, reacting with the polymer. Acid is again generated and reacts with unreacted polymer. The polymer is then dissolved in a developing solution. In contrast, the polymer at the non-exposed region maintains its structure which is insoluble to the developing solution. With such a mechanism, a good profile pattern can be made on a wafer substrate. The amount of actinic radiation used is an amount sufficient to render the exposed portions of the photoresist layer imagewise soluble in a suitable developer. Preferably, UV radiation is used in an amount sufficient to render the exposed portions of the photoresist layer imagewise soluble in a suitable developer. Exposure doses preferably range from about 5 $mJ/cm^2$ to about 300 $mJ/cm^2$, more preferably from about 5 $mJ/cm^2$ to about 100 $mJ/cm^2$ and still more preferably from about 10 $mJ/cm^2$ to about 30 $mJ/cm^2$. In one example, exposure is done via an ArF laser, i.e. at a wavelength of from about 193 nm. When an ArF laser is used for exposure, exposure doses preferably ranges from about 1 $mJ/cm^2$ to about 10 $mJ/cm^2$, more preferably from about 2 $mJ/cm^2$ to about 8 $mJ/cm^2$.

Preferably the process further comprises the step of heating the imagewise exposed photosensitive composition prior to developing, such as by baking, for a sufficient time and temperature to increase the rate at which the acid decomposes the polymer in the imagewise exposed areas of the photosensitive composition. This drives the acid reaction for better image formation. Such a heat treatment may be conducted at temperatures of from about 50° C. to about 150° C., preferably from about 120° C. to about 150° C. for from about 30 seconds to about 2 minutes.

The development step may be conducted by immersion in a suitable developing solution. The solution is preferably agitated, for example, by nitrogen burst agitation. The substrates are allowed to remain in the developer until all, or substantially all, of the resist coating has dissolved from the irradiated areas. Typical examples of the aqueous alkaline solutions suitable as the developer include sodium hydroxide, tetramethylammonium hydroxide, or aqueous solutions of hydroxides of metals belonging to the Groups I and II of the periodic table such as potassium hydroxide. Aqueous solution of organic bases free from metal ions such as tetraalkylammonium hydroxide, for example, tetramethylammonium hydroxide (TMAH), tetraethylammonium hydroxide (TEAH) and tetrabutylammonium hydroxide (TBAH). More preferably, tetramethylammonium hydroxide (TMAH) are preferred. Furthermore, if desired, the aqueous basic solution used as the developer may additionally contain any additives such as a surface active agent in order to improve the resulting development effect. After removal of the coated wafers from the developing solution, an optional, although not required, post-development heat treatment or bake may be employed to increase the adhesion of the coating as well as resistance to etching solutions and other substances. The post-development heat treatment can comprise the oven baking of the coating and substrate below the coating's softening point.

The remaining photoresist layer is then overall exposed to sufficient electron beam radiation to render the patterned image more resistant to an etchant such as oxygen plasma etchants and chlorine etchants. The electron beam irradiating is conducted with a uniform, large-area, overall electron beam exposure source which simultaneously exposes substantially all of the image areas of the photosensitive composition simultaneously. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision Corporation under the trade name "ElectronCure™". The principles of operation and performance characteristics of such device are described in U.S. Pat. No. 5,003,178, the disclosure of which is incorporated herein by reference. The electron beam energy is preferably from about 0.5 to about 30 KeV, and more preferably from about 1 to about 12 KeV and most preferably from about 9 to about 9 KeV. The dose of electrons is from about 1 to about 500,000 $\mu C/cm^2$, preferably from about 50 to about 50,000 $\mu C/cm^2$ and more preferably from about 50 to about 5,000 $\mu C/cm^2$. The gas ambient in the electron beam tool can be any of the following gases: nitrogen, oxygen, hydrogen, argon, xenon, helium, ammonia, silane, a blend of hydrogen and nitrogen, ammonia or any combination of these gases. The electron beam current is preferably from about 1 to about 150 mA, and more preferably from about 1 to about 50 mA. The electron beam irradiating is conducted while the substrate is under a vacuum, for example while vacuum conditions are maintained in the range of from about $10^{-5}$ to about $10^2$ torr. Preferably, the electron beam exposing step is conducted with a wide, large beam of electron beam radiation from a uniform large-are electron beam source which simultaneously covers the entire substrate area, i.e. an area of from about 4 inches to about 256 square inches. The end result of the electron beam treatment will be photoresist layers which are less soluble after exposure than prior to exposure. The resist compositions of the present invention are resistant to acid-base etching solutions and provide effective protection for the unexposed resist-coated areas of the substrate.

An important feature of the invention is that the photoresist and substrate are cooled during the electron beam exposure to a temperature of less than 20° C. provided that moisture condensation conditions are avoided; preferably less than about 10° C., and more preferably less than about 5° C. In a useful embodiment, the temperature is maintained at from about −10° C. to about 20° C., and more preferably from about −10° C. to about 10° C., and still more preferably from about −10° C. to about 5° C.

Figure 1B:
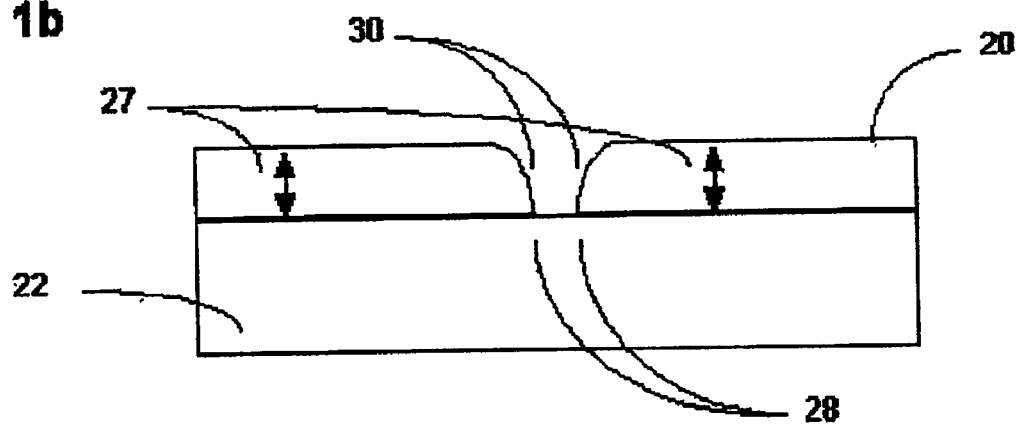
FIG. 1b shows problem of resist shrinkage vertically and horizontally during electron beam exposure.
Figure 2A:
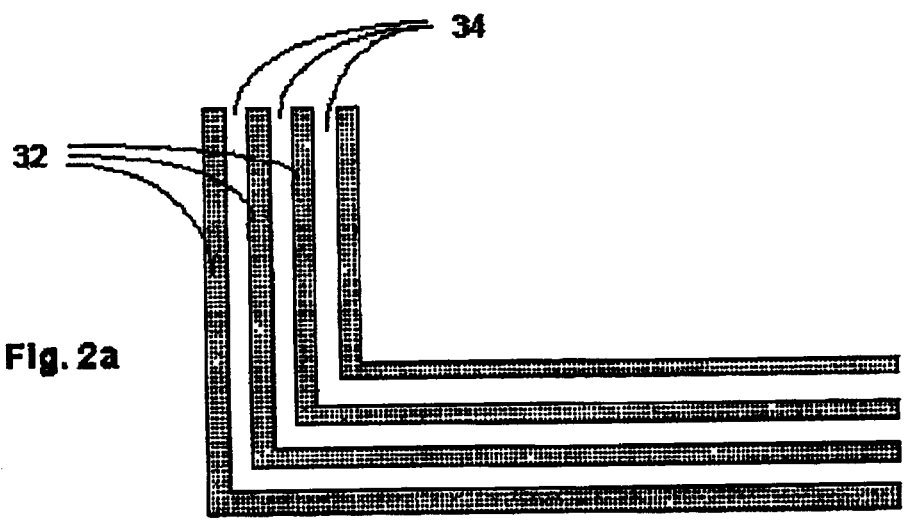
FIG. 2a shows a top view of an exemplary lithographic feature in the form of lines of photoresist and spaces with right angle corners.
Figure 2B:
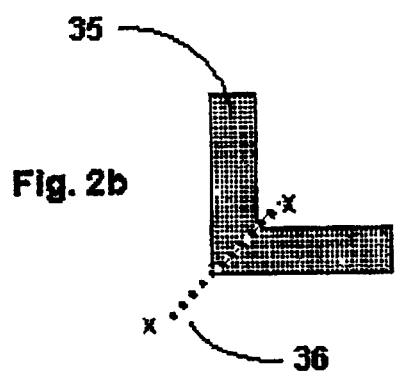
FIG. 2b shows a magnified view of a corner of a photoresist line.
Figure 2C:
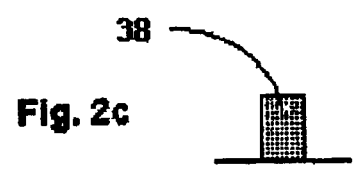
FIG. 2c shows a cross section of the resist cleaved vertically through the corner of the photoresist along line XX and viewed on end.
Figure 2D:
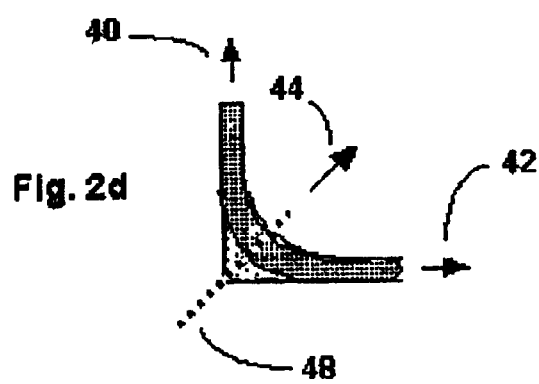
FIG. 2d shows shrinkage along the line of the photoresist created by a tension pulling away from the corner.
Figure 2E:
FIG. 2e shows a deformed photoresist corner in end view.

The following figures illustrate the improvement of the invention compared to the previous results in the art. FIGS. 1a and 1b show the problem in the art by means of a cross section of a contact hole 24 in a photoresist 20 before and after electron beam exposure. After imagewise exposure and development but before electron beam exposure, via or contact hole 24 in the photoresist 20 has vertical sidewalls 26 from the top surface of the photoresist down to the substrate or wafer 22 as seen in FIG. 1a. During electron beam exposure there is a volume shrinkage of the photoresist. The photoresist shrinks vertically, and horizontally, shown as 27 in FIG. 1b. At the photoresist/substrate interface 28 the resist is restrained from shrinking laterally due to the adhesion of the resist to the substrate's surface. The upper portion of the contact hole in the resist is not so constrained and therefore shrinks laterally creating a widened opening 30 at the top of the via or contact hole. A similar effect may occur for other lithographic features such as lines or troughs in photoresists and particularly corners and ends of lines in photoresists. Shown in FIGS. 2a–2e is an illustration of another lithographic feature, which exhibits a similar effect but due to its geometry is asymmetric in its deformation under electron beam exposure. Shown in FIG. 2a is a top view of lines of photoresists 32 and spaces 34 (no resist) with right angle corners. A magnified view of the corner 35 of the photoresist line is shown in FIG. 2b. A cross section of the photoresist, if cleaved vertically through the corner of the resist along the line 36 (shown as XX in FIG. 2b) and viewed on end would appear as 38 in FIG. 2c. If this line and space pattern is irradiated by electron beam, there is again a volume shrinkage in the photoresist. The photoresist is constrained from shrinking laterally at the lower portion of the resist due to its adhesion to the substrate. However, at the upper portion of the photoresist it is unconstrained and shrinks laterally. Further, the photoresist shrinks along the length of the two lines intersecting at the corner. This shrinkage along the line of the photoresist creates a tension pulling away from the corner, in the directions shown as 40 and 42 in FIG. 2d. These two force vectors create a net force 44 pulling inward on the corner of the resist causing the top surface of the photoresist to fold over its inside edge. This deforms the photoresist corner as can be seen in FIG. 2e, in the end-on view 46 of the cleaved cross section of the corner through the line indicated by 48 in FIG. 2d. These deformations in photoresist features are not desired due to the fact that in a subsequent etching step this taper profile may be transferred to the underlying feature during the etching process.

Figure 3:
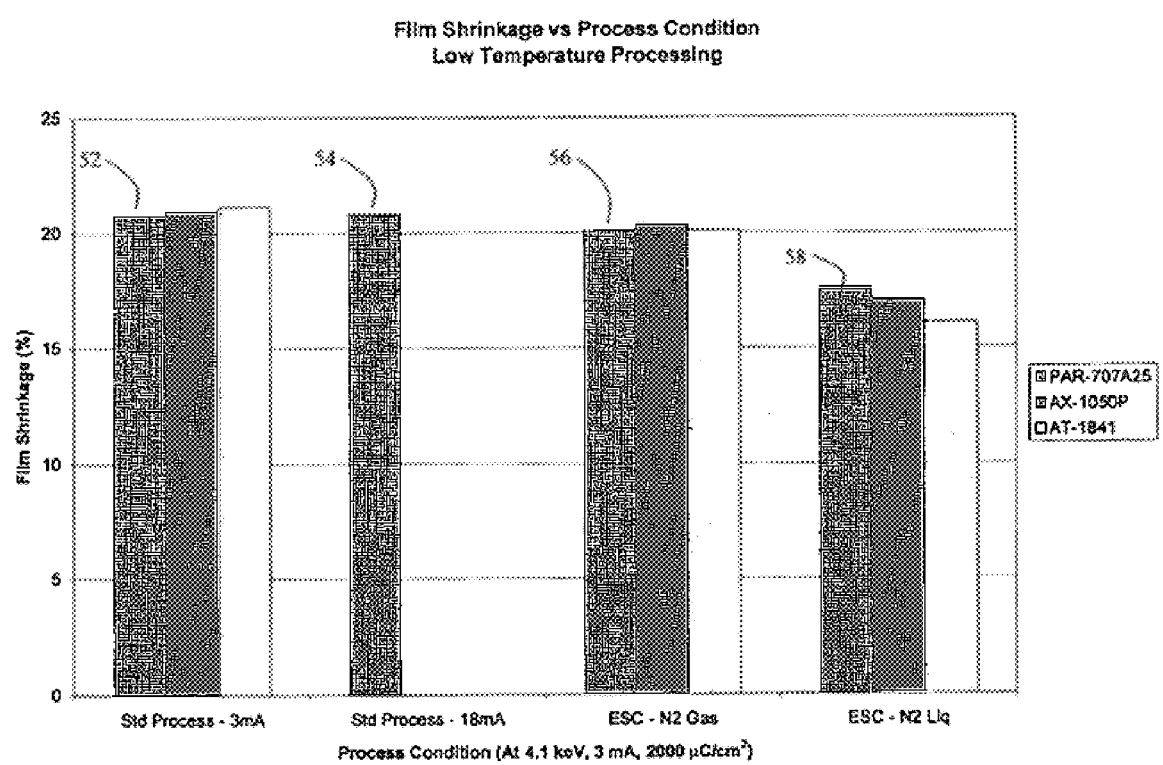
FIG. 3 shows a graph of the volume shrinkage for two different process conditions including current densities but at equivalent electron beam dose.

Therefore, it would be very beneficial to cure the distortion caused by electron beam irradiation of the resist images exemplified in this pattern deformation or pullback effect illustrated in FIGS. 1a–1b and FIGS. 2a–2e. One prior attempt to reduce this pullback effect was to minimize heating of the photoresist by reducing the flux (current density) of the incident large area electron beam. In FIG. 3, the volume shrinkage is shown for two different process conditions including current densities but at equivalent electron beam dose. The graph 52 exemplifies photoresist shrinkage for a 3 mA electron beam current, and graph 54 shows the shrinkage for an 18 mA electron beam current. In 52, the temperature of the wafer and photoresist reach 52° C., whereas for 54 the wafer and resist reach 54° C. Both of these samples exhibit almost identical volume shrinkage, and for the lithographic features described above still exhibited pullback of the resist. Actively cooling the resist during electron beam exposure only made a very slight change in the volume (vertical) shrinkage of the resist. In FIG. 3, the shrinkage for the resist maintained at 24° C., at 56 shows almost the identical shrinkage as the resist 54 that reached a temperature of 54° C. Even reducing the temperature to between –5° C. and –10° C. at 58, only results in a difference of 3.5% (17.5% versus 21%) in volume shrinkage over the standard process with ending resist temperature of 54° C. As also can be seen by FIG. 3, different formulations of photoresist had little effect on the volume shrinkage of the resist. The 193 nm photoresists indicated are Clariant, AX-1050P and AT-1841, (Clariant Corporation, Summerville, N.J., USA) and Sumitomo PAR-707A25 (Sumitomo Chemical Co. Ltd. Osaka, Japan).

Figure 4:
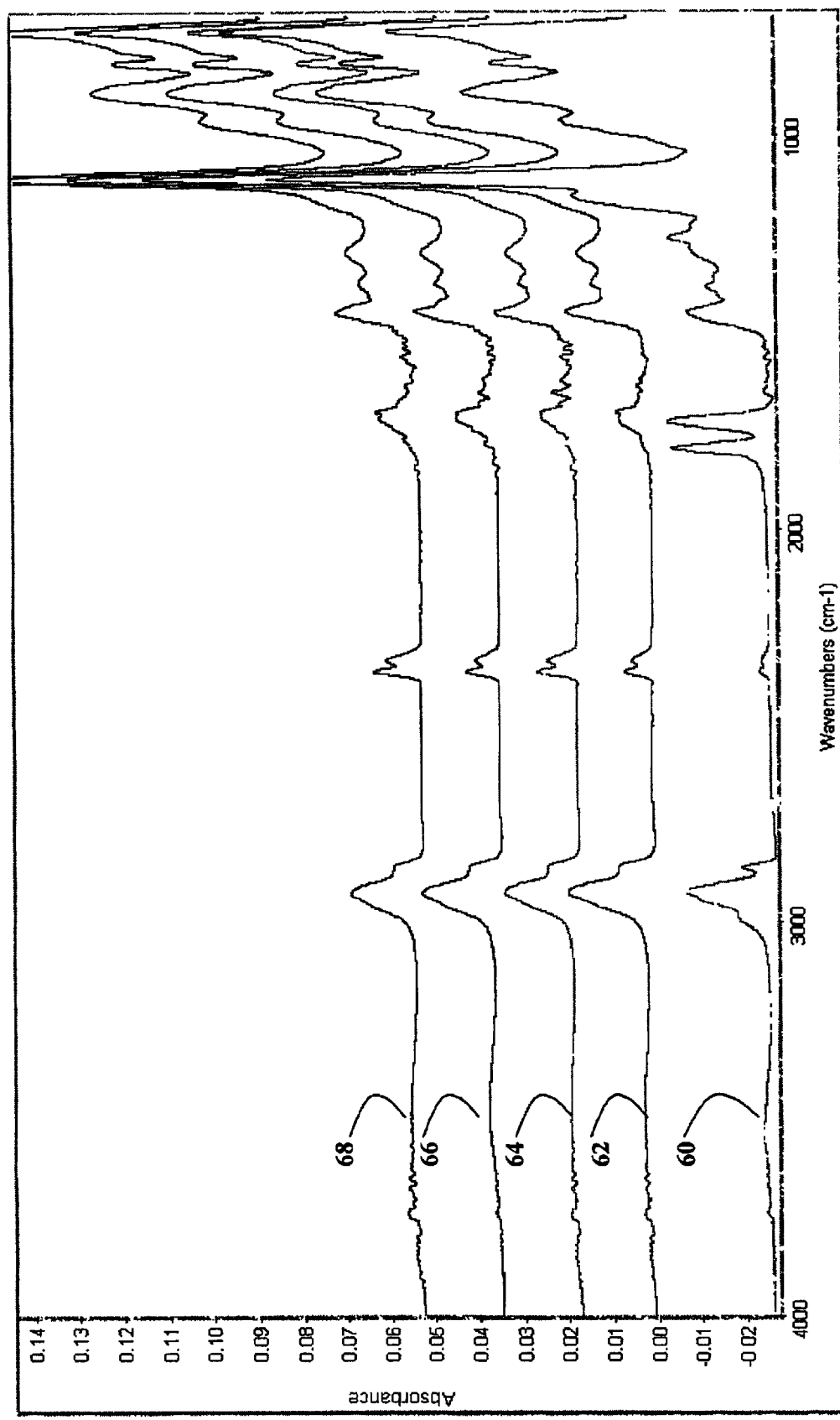
FIG. 4 shows FTIR spectra for a photoresist before and after e-beam processing using various different process conditions and photoresist temperatures.

To determine if actively cooling the resist would make a change on the mass loss, the FTIR spectra of the resist films before and after processing with and without cooling are observed. Shown in FIG. 4 is the FTIR spectra for the PAR-707A25 photoresist before 60 and after 62, 64, 66, and 68 e-beam processing. As can be seen from the various different process conditions and different resist temperatures, cooling the resist does not alter the composition of the resulting resist. Since there are no compositional changes in the resist due to cooling during e-beam exposure and there is very little change in volume shrinkage of the resist versus temperature during e-beam exposure one would expect that actively cooling the resist during e-beam exposure would not affect the resist deformation or pullback artifacts described above.

Surprisingly, however, it has been found that by simultaneously actively cooling the wafer to hold a temperature below 20° C. and preferably below 10° C. that the pullback on the upper region of lithographic images in resist can be virtually eliminated during electron beam processing. This result was unexpected due to the fact that the glass transition temperature of these photoresists is much higher than 20° C. For example, these photoresists are typically baked at temperatures in excess of 80° C. after lithographic patterning: It is therefore surprising since there is very little difference in volume shrinkage and no compositional changes (as detected by FTIR) that cooling the resist would effect the resist deformation.

Further, by simultaneous e-beam flood exposure of the photoresist while actively cooling the substrate and the resist another unexpected result was that the uniformity and circularity of the contact hole (via) improved. Shown in FIG. 5a is a contact hole or via prior to e-beam exposure. The contact via is not perfectly round and shows several asymmetries when viewed from the top surface of the via. After the standard process (non cooled) e-beam exposure, the contact hole remains asymmetric and deformed, FIG. 5b. After the process of invention with electron beam flood exposure and simultaneous cooling, the contact hole has formed a uniform circular shape, FIG. 5c. This effect is not fully understood but is useful in the formation of symmetrical geometries and contact vias.

FIG. 6 shows an apparatus useful for performing the invention. A wafer 70 is placed on an electrostatic platform 72 which comprises an electrically conductive wafer support having an electrically conductive top surface and a nonelectrically conductive layer on the wafer support. The power supply shown applies a substantially uniform electric field across the electrically conductive surface for holding a wafer on the support via the nonelectrically conductive layer; which is cooled by a refrigerant such as a gas or heat-dissipating or refrigeration device such as cooling fins and/or other fluid heat transport 73 and 74 for dissipating heat from the platform (chuck) and maintaining the temperature of the wafer and the photoresist thereon to the desired temperatures of less than 20° C. of this invention. The electrostatic force flattens the wafer 70 against the platen 72 improving the thermal contact between the wafer and the platen 72 (or electrostatic chuck). Thereafter, the wafer temperature is held closely to the same temperature as the electrostatic platform. The electron source is a large area electron source comprising of a cathode 76 and anode 78 and can be any large area exposing flux of electrons. The preferred electron source further described in U.S. Pat. No. 5,003,178 which is incorporated herein by reference. The process is preferably carried out in a soft vacuum environment of from 0–10 torr, more preferably between 10–70 millitorr. The electrostatic chuck, electron beam source and refrigerant are preferably maintained within an enclosure to control and maintain the low temperature and vacuum. A voltage is applied 80 to conductive element 82, which is insulated by dielectric layer 72 between the wafer and the electrostatic chuck 72. The wafer is grounded via contact 86. The electron beam 84 exposes the photoresist on the wafer while the chuck 72 and wafer 70 are held at temperature below 20° C. and more preferably below 10° C. By utilizing refrigerant fluids, the electrostatic chuck may be kept at preferred temperatures below 0° C. The heat dissipation capabilities of the chuck 72 are made sufficiently large such that the amount of radiant energy incident on the wafer by the electron beam will not raise the temperature of the wafer by more than a few degrees above the temperature of the electrostatic chuck 72. Further, a cooling gas may be utilized to provide more effective heat transfer from the substrate (wafer) to the electrostatic chuck 72. The cooling gas may be introduced between the electrostatic chuck 72 and the substrate via holes or grooves in the surface of the chuck. Electrostatic chucks are well known in the art, however, such are not known to employ a refrigerant capable of maintaining a semiconductor wafer and applied photoresist at the electron beam exposure temperatures of this invention. See, for example U.S. Pat. No. 6,195,246 which is incorporated herein by reference.

Figure 7:
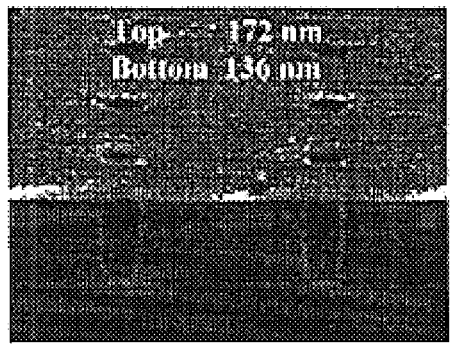
FIG. 7 shows scanning electron micrographs of contact holes obtained at various processing conditions.
Figure 7:
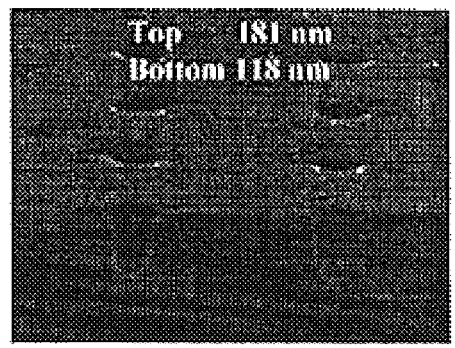
Figure 7:
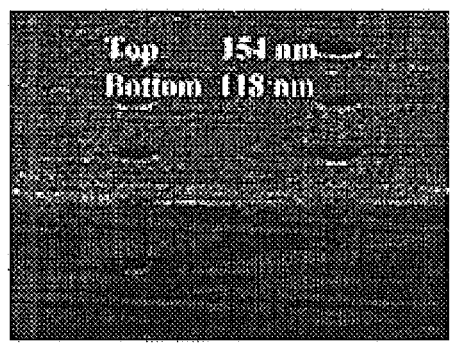
Figure 7:
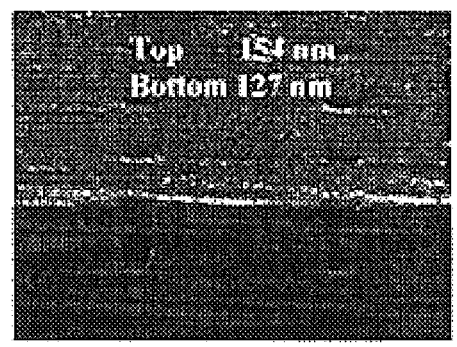

Utilizing the apparatus and method of the invention the pullback and deformation of photoresist features is essentially eliminated. Shown in FIG. 7 are scanning electron micrographs of contact holes. The taper of the hole prior to electron beam treatment (labeled No curing in FIG. 7 is 36 nm). The micrograph labeled Std. Process in FIG. 7 which utilized 2000 microcoulomb/cm$^2$ dose of electrons at 4.1 keV without active cooling shows the pullback on the upper edge of the resist (resist thickness is 400 nanometers). This caused the contact hole to widen at the top and the taper of the hole to increase by 27 nm (63 nm–36 nm) over the unprocessed case. The micrograph labeled LT process of FIG. 7 utilized the same electron beam exposure conditions as the standard process but with active cooling of the wafer and resist (maintaining a temperature of approximately minus 10 degrees Celsius) shows no widening or deformation of the top of the contact hole in the resist (the taper 36 nm is identical to the unprocessed case). Using an electrostatic chuck to actively cool the resist and wafer during electron beam treatment, where the wafer and resist were maintained at a temperature of approximately 25° C. during electron beam treatment, shows a decrease in the taper of 9 nm (27 nm–36 nm) from bottom to top. This is shown in the micrograph labeled ESC process of FIG. 7.

Alternative arrangements may be utilized to practice the invention, i.e., utilizing a large area electron beam while simultaneously cooling the irradiated material. Further benefits may result with other materials cooled to even lower temperatures (20° C., 10° C., –10°, etc.) during the process. These alternative process conditions can be readily achieved with the apparatus of the invention described herein.

The following non-limiting examples serve to illustrate the invention.

EXAMPLE 1

A layer of 193 nm photoresist (e.g., Sumitomo PAR-101A4) is spin-coated onto a silicon substrate. This substrate has some semiconductor structures already in it. The dispense volume is 3–4 ml. The resist is spread over the substrate with a slow spin, 700–1000 rpm for ~10 seconds. Then the spin speed is ramped to 3000 rpm and remains there for 20–30 seconds. The photoresist layer and substrate are softbaked at 120° C. for 60 seconds on a hot plate to drive off most of the solvent. The film thickness decreases during the softbake as solvent is evolved. After the softbake the thickness is about 3,000 Å (with the coat and bake conditions described above). The photoresist film is exposed to actinic radiation; in this case, radiation of 193 nm wavelength, by a 193 nm stepper such as ISI ArF Microstepper, SVGL 193 Micrascan or ASML PAS 5500/900, with a numerical aperture of 0.6 to 0.75 and a typical exposure dose of 5–30 mJ/cm$^2$. This causes photoacid to be generated. The photoresist film undergoes a post-exposure bake at 120° C. for 60 seconds to thermally activate the deprotection reaction. The result is an ideally large differential dissolution between the exposed and unexposed areas. The photoresist film is developed in an industry-standard 2.38 wt % aqueous TMAH (tetramethylammonium hydroxide) developer solution. The exposed areas are dissolved away (for a positive photoresist) and the unexposed areas are left, forming the desired resist pattern. Photoresist residue is removed from the substrate in an oxygen plasma de-scumming process. The substrate then undergoes the electron beam irradiation treatment in the ElectronCure™ tool made by Electron Vision Corporation. The electron beam process modifies the photoresist film (perhaps initiates cross-linking) to make it more thermally stable and mechanically robust, in preparation for etch processing. FTIR analysis indicates cross-linking of the electron beam exposed resist. The electron beam radiation is conducted on two samples, a first sample where the photoresist temperature is maintained at 54° C. and a second sample at –10° C. The lithographic features are then examined under a scanning electron microscope. The first sample exhibits pullback of the resist while little or no pullback is observed for the second sample.

EXAMPLE 2

A layer of 193 nm photoresist, Sumitomo PAR-707A25, is spin-coated onto 150 mm silicon wafers. The spin coater is a bench top Laurell spinner. The dispense volume is 3–5 ml. The resist is spread over the substrate with a slow spin, 700–1000 rpm for ~10 seconds. Then the spin speed is ramped to 3000 rpm and remains there for 20 seconds. The photoresist layer and substrate are softbaked at 130° C. for 60 seconds on a hot plate to drive off most of the solvent. The film thickness decreases during the softbake as solvent is evolved. After the softbake the thickness is about 3,000 Å (with the coat and bake conditions described above).

After coating and baking the film thickness of the resist was measured with an M-88 spectroscopic ellipsometer from J. A. Woollam Inc. and the FTIR spectra were collected using a 760 Magna-IR from Thermo-Nicolet Inc.

The substrate then undergoes the electron beam irradiation treatment in the ElectronCure™ tool made by Electron Vision Corporation. The electron beam process modifies the photoresist film (perhaps initiates cross-linking) to make it more thermally stable and mechanically robust, in preparation for etch processing. FTIR analysis indicates cross-linking of the electron beam exposed resist material. For the standard electron beam process the wafer is positioned on pins such that there is no thermal connection between the wafer and the chamber. During the electron beam exposure at 3.5 keV, 6 mA, and 2000 □C/cm$^2$, the wafer temperature rises from approximately 25° C. to in excess of 40° C.

For the ESC and LT processes, the wafer is positioned on an electro-static chuck (ESC) in the process chamber. This provides a thermal connection to the cooled electro-static chuck during the electron beam exposure. For the ESC process nitrogen gas is run through the cooling coils inside the electro-static chuck. The temperature of the gas was approximately 20 to 25° C. In this case the wafer temperature was observed to rise from approximately 23° C. to approximately 27° C. to 30° C. For the LT process liquid nitrogen was run through the cooling coil in the electro-static chuck. For the exposures in this experiment the wafer was cooled to approximately −5 to −10° C. and during the exposure the wafer temperature was observed to rise to approximately −5 to 5° C. After processing the film thickness and FTIR were measured. The film shrinkage was seen to be highest for the standard process, slightly lower for the ESC process and lowest for the LT process. No difference was seen in the FTIR spectra that were collected after processing.

EXAMPLE 3

A layer of Clariant AX 1050P 193 nm photoresist is spin-coated onto blank 150 mm silicon wafers. The resist is spread over the substrate with a slow spin, 700–1000 rpm for ~10 seconds. Then the spin speed is ramped to 3000 rpm and remains there for 20 seconds. The photoresist layer and substrate are softbaked at 130° C. for 60 seconds on a hot plate to drive off most of the solvent. The film thickness decreases during the softbake as solvent is evolved. After the softbake the thickness is about 4,000 Å (with the coat and bake conditions described above). Two sets of samples were prepared, one set of blanket coatings and a second set for patterning. For the patterned wafer set the photoresist film is exposed to actinic radiation in an ISI ArF Microstepper 193 nm stepper, with a numerical aperture of 0.6 a partial coherence of 0.7 and a typical exposure dose of 10–40 mJ/cm$^2$. This causes photoacid to be generated. The photoresist film undergoes a post-exposure bake at 120° C. for 60 seconds to thermally activate the deprotection reaction. The result is an ideally large differential dissolution between the exposed and unexposed areas. The photoresist film is developed in AZ 300MIF, an industry-standard 2.38 wt % aqueous TMAH (tetramethylammonium hydroxide) developer solution. The exposed areas are dissolved away (for a positive photoresist) and the unexposed areas are left, forming the desired resist pattern. For the blanket wafer set the film thickness of the resist was measured with an M-88 spectroscopic ellipsometer from J. A. Woollam Inc. and the FTIR spectra were collected using a 760 Magna-IR from Thermo-Nicolet Inc. The substrate then undergoes the electron beam irradiation treatment in the ElectronCure tool made by Electron Vision Corporation. The electron beam process modifies the photoresist film (perhaps initiates cross-linking) to make it more thermally stable and mechanically robust, in preparation for etch processing. FTIR analysis indicates cross-linking of the electron beam exposed resist. For the standard electron beam process the wafer is positioned on pins such that there is no thermal connection between the wafer and the chamber. During the electron beam exposure at 3.5 keV, 6 mA, and 2000 □C/cm$^2$, the wafer temperature rises from approximately 25° C. to in excess of 40° C.

For the ESC and LT processes, the wafer is positioned on an electrostatic chuck (ESC) in the process chamber. This provides a thermal connection to the cooled electro-static chuck during the electron beam exposure. For the ESC process nitrogen gas is run through the cooling coils inside the electro-static chuck. The temperature of the gas was approximately 20 to 25° C. In this case the wafer temperature was observed to rise from approximately 23° C. to approximately 27° C. to 30° C. For the LT process liquid nitrogen was run through the cooling coil in the electro-static chuck. For the exposures in this experiment the wafer was cooled to approximately −5 to −10° C. and during the exposure the wafer temperature was observed to rise to approximately −5 to 5° C. For the blanket coated wafers the film thickness and FTIR were measured after electron beam processing. The film shrinkage was seen to be highest for the standard process, slightly lower for the ESC process and lowest for the LT process. No difference was seen in the FTIR spectra that were collected after processing. For the patterned wafers the resist features were inspected using a KLA-8100 scanning electron microscope (SEM). When compared to the unexposed features the standard process showed the most significant pull-back. The ESC process showed a lower level of pull-back while the LT process showed the lowest level of the conditions considered. The blanket coated resist wafers were then process through a 60 second poly-si etch process in an Applied Materials P-5000 poly-si etch chamber. The untreated resist showed a bulk resist etch rate of approximately 95 nm/min while all of the electron beam treated wafers showed etch rates of approximately 50 nm/min. Thus, the electron beam process provides a significant reduction in the etch rate of the resist and by simultaneously cooling the resist to low temperature (−5° C. to 5° C.) the pattern deformation or pullback is minimized.

While the present invention has been particularly shown and described with reference to preferred embodiments, it will be readily appreciated by those of ordinary skill in the art that various changes and modifications may be made without departing from the spirit and scope of the invention.

What is claimed is:

1. A method for producing an etch resistant image, which comprises:
   (a) coating and drying a photosensitive composition onto a substrate, which photosensitive composition comprise:
      (i) at least one water insoluble, acid decomposable polymer which is substantially transparent to ultraviolet or x-ray radiation, wherein said polymer is present in the photosensitive composition in an amount sufficient to form a uniform film of the composition components when it is coated on a substrate and dried;
      (ii) at least one photosensitive compound capable of generating an acid upon exposure to sufficient activating ultraviolet, electron beam or x-ray radiation energy, said photosensitive compound being present in an amount sufficient to substantially uniformly photosensitize the photosensitive composition;
   (b) imagewise exposing the photosensitive composition to sufficient activating ultraviolet, electron beam or x-ray radiation energy to cause the photosensitive compound to generate sufficient acid to decompose the polymer in the imagewise exposed areas of the photosensitive composition;
   (c) developing the photosensitive composition to thereby remove the exposed nonimage areas and leaving the unexposed image areas of the photosensitive composition;
   (d) irradiating the image areas of the photosensitive composition to sufficient electron beam radiation to thereby increase the resistance of the photosensitive composition in the image areas to an etchant while simultaneously cooling the photosensitive composition during electron beam radiation to maintain the photosensitive composition at a temperature of less than about 20° C.

2. The method of claim 1 wherein the at least one water insoluble, acid decomposable polymer is substantially transparent to ultraviolet radiation at a wavelength of about 157 nm; wherein the at least one photosensitive compound is capable of generating an acid upon exposure to sufficient activating energy at a wavelength of about 157 nm; and wherein the imagewise exposing of the photosensitive composition to sufficient activating energy is conducted at a wavelength of about 157 nm.

3. The method of claim 1 wherein the at least one water insoluble, acid decomposable polymer is substantially transparent to ultraviolet radiation at a wavelength of about 193 nm; wherein the at least one photosensitive compound is capable of generating an acid upon exposure to sufficient activating energy at a wavelength of about 193 nm; and wherein the imagewise exposing of the photosensitive composition to sufficient activating energy is conducted at a wavelength of about 193 nm.

4. The method of claim 1 wherein the at least one water insoluble, acid decomposable polymer is substantially transparent to ultraviolet radiation at a wavelength of about 248 nm; wherein the at least one photosensitive compound is capable of generating an acid upon exposure to sufficient activating energy at a wavelength of about 248 nm; and wherein the imagewise exposing of the photosensitive composition to sufficient activating energy is conducted at a wavelength of about 248 nm.

5. The method of claim 1 wherein the at least one water insoluble, acid decomposable polymer is substantially transparent to x-ray wavelength radiation; wherein the at least one photosensitive compound is capable of generating an acid upon exposure ta sufficient activating energy at x-ray wavelengths; and wherein the imagewise exposing of the photosensitive composition to sufficient activating energy is conducted at an x-ray wavelength.

6. The method of claim 1 wherein the at least one photosensitive compound is capable of generating an acid upon exposure to sufficient activating electron beam radiation; and wherein the imagewise exposing of the photosensitive composition to sufficient activating energy is conducted by electron beam radiation.

7. The method of claim 1 wherein the irradiating to electron beam radiation is conducted at a temperature of from about −10° C. to about 10° C.

8. The method of claim 1 wherein the irradiating to electron beam radiation is conducted at a temperature of from about −10° C. to about 5° C.

9. The method of claim 1 wherein the irradiating to electron beam radiation is conducted under vacuum conditions.

10. The method of claim 1 wherein step (d) is conducted at a temperature of less than 20° C.

11. A method for producing a microelectronic device image, which comprises:
  (a) coating and drying a photosensitive composition onto a semiconductor substrate, which photosensitive composition comprises:
    (i) at least one water insoluble, acid decomposable polymer which is substantially transparent to ultraviolet or x-ray radiation, wherein said polymer is present in the photosensitive composition in an amount sufficient to form a uniform film of the composition components when it is coated on a substrate and dried;
    (ii) at least one photosensitive compound capable of generating an acid upon exposure to sufficient activating ultraviolet, electron beam or x-ray radiation energy, said photosensitive compound being present in an amount sufficient to substantially uniformly photosensitize the photosensitive composition;
  (b) imagewise exposing the photosensitive composition to sufficient activating ultraviolet, electron beam or x-ray radiation energy to cause the photosensitive compound to generate sufficient acid to decompose the polymer in the imagewise exposed areas of the photosensitive composition;
  (c) developing the photosensitive composition to thereby remove the exposed nonimage areas and leaving the unexposed image areas of the photosensitive composition;
  (d) irradiating the image areas of the photosensitive composition to sufficient electron beam radiation to thereby increase the resistance of the photosensitive composition in the image areas to an etchant while simultaneously cooling the photosensitive composition during electron beam radiation to maintain the photosensitive composition at a temperature of less than about 20° C.

12. The method of claim 11 wherein the at least one water insoluble, acid decomposable polymer is substantially transparent to ultraviolet radiation at a wavelength of about 157 nm; wherein the at least one photosensitive compound is capable of generating an acid upon exposure to sufficient activating energy at a wavelength of about 157 nm; and wherein the imagewise exposing of the photosensitive composition to sufficient activating energy is conducted at a wavelength of about 157 nm.

13. The method of claim 11 wherein the at least one water insoluble, acid decomposable polymer is substantially transparent to ultraviolet radiation at a wavelength of about 193 nm; wherein the at least one photosensitive compound is capable of generating an acid upon exposure to sufficient activating energy at a wavelength of about 193 nm; and wherein the imagewise exposing of the photosensitive composition to sufficient activating energy is conducted at a wavelength of about 193 nm.

14. The method of claim 11 wherein the at least one water insoluble, acid decomposable polymer is substantially transparent to ultraviolet radiation at a wavelength of about 248 nm; wherein the at least one photosensitive compound is capable of generating an acid upon exposure to sufficient activating energy at a wavelength of about 248 nm; and wherein the imagewise exposing of the photosensitive composition to sufficient activating energy is conducted at a wavelength of about 248 nm.

15. The method of claim 11 wherein the at least one water insoluble, acid decomposable polymer is substantially transparent to x-ray wavelength radiation; wherein the at least one photosensitive compound is capable of generating an acid upon exposure to sufficient activating energy at x-ray wavelengths; and wherein the imagewise exposing of the photosensitive composition to sufficient activating energy is conducted at an x-ray wavelength.

16. The method of claim 11 wherein the at least one photosensitive compound is capable of generating an acid upon exposure to sufficient activating electron beam radiation; and wherein the imagewise exposing of the photosensitive composition to sufficient activating energy is conducted by electron beam radiation.

17. The method of claim 11 wherein the irradiating to electron beam radiation is conducted at a temperature of from about −10° C. to about 10° C.

18. The method of claim 11 wherein the irradiating to electron beam radiation is conducted at a temperature of from about −10° C. to about 5° C.

19. The method of claim 11 wherein the irradiating to electron beam radiation is conducted under vacuum conditions.

20. A microelectronic device image produced by a process, which comprises:
(a) coating and drying a photosensitive composition onto a semiconductor substrate, which photosensitive composition comprises:
  (a) coating and drying a photosensitive composition onto a semiconductor substrate, which photosensitive composition comprises:
    (i) at least one water insoluble, acid decomposable polymer which is substantially transparent to ultraviolet or x-ray radiation, wherein said polymer is present in the photosensitive composition in an amount sufficient to form a uniform film of the composition components when it is coated on a substrate and dried;
    (ii) at least one photosensitive compound capable of generating an acid upon exposure to sufficient activating ultraviolet, electron beam or x-ray radiation energy, said photosensitive compound being present in an amount sufficient to substantially uniformly photosensitize the photosensitive composition;
(b) imagewise exposing the photosensitive composition to sufficient activating ultraviolet, electron beam or x-ray radiation energy to cause the photosensitive compound to generate sufficient acid to decompose the polymer in the imagewise exposed areas of the photosensitive composition;
(c) developing the photosensitive composition to thereby remove the exposed nonimage areas and leaving the unexposed image areas of the photosensitive composition;
(d) irradiating the image areas of the photosensitive composition to sufficient electron beam radiation to thereby increase the resistance of the photosensitive composition in the image areas to an etchant while simultaneously cooling the photosensitive composition during electron beam radiation to maintain the photosensitive composition at a temperature of less than about 20° C.

21. The image produced according to claim 20 wherein step (d) is conducted at a temperature of less than 20° C.

* * * * *